(12) United States Patent
Kodama et al.

(10) Patent No.: US 7,741,926 B2
(45) Date of Patent: Jun. 22, 2010

(54) FREQUENCY SYNTHESIZER HAVING IMPROVED FREQUENCY HOPPING

(75) Inventors: Hiroshi Kodama, Tokyo (JP); Akio Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 111 days.

(21) Appl. No.: 12/063,453

(22) PCT Filed: Jul. 24, 2006

(86) PCT No.: PCT/JP2006/314553

§ 371 (c)(1),
(2), (4) Date: Feb. 11, 2008

(87) PCT Pub. No.: WO2007/018030

PCT Pub. Date: Feb. 15, 2007

(65) Prior Publication Data

US 2009/0108945 A1    Apr. 30, 2009

(30) Foreign Application Priority Data

Aug. 9, 2005    (JP)    ............................. 2005-230617

(51) Int. Cl.
*H04L 27/12* (2006.01)
*H04B 1/713* (2006.01)
(52) U.S. Cl. ..................... 332/100; 375/135; 375/307
(58) Field of Classification Search .................. 331/46, 331/49, 55; 332/100, 101, 102, 117, 119, 332/123; 375/130, 132, 135, 303, 307; 455/323
See application file for complete search history.

(56) References Cited

U.S. PATENT DOCUMENTS 6,268,778 B1 *   7/2001   Mucke et al. ........... 331/117 R (Continued)

FOREIGN PATENT DOCUMENTS

JP    2001-077632 A    3/2001

(Continued)

OTHER PUBLICATIONS

D. Leenaerts et al., "A SiGe BiCMOS 1ns Fast Hopping Frequency Synthesizer for UWB Radio", Solid-State Circuits Conference, Digest of Technical Papers, ISSCC, IEEE International, Feb. 10, 2005, pp. 202, 203 and 593.

(Continued)

*Primary Examiner*—Robert Pascal
*Assistant Examiner*—Ryan Johnson
(74) *Attorney, Agent, or Firm*—Young & Thompson

(57) ABSTRACT

A frequency synthesizer switches the frequency at a high rate, is of low power consumption, and has a high signal-to-noise ratio. CMOS quadrature VCOs 31, 32 generate and output four-phase signals 36, 37, respectively. CMOS selector 33 selects either one of two four-phase signals 36, 37 generated by CMOS quadrature VCOs 31, 32 and outputs the selected signal as output signal 38. CMOS SSB mixer 34 multiplies output signal 38 selected by CMOS selector 33 and four-phase input signal 39 input from an external source by each other to generate a signal having a frequency represented by the sum of, or the difference between, the frequency of output signal 38 and the frequency of four-phase input signal 39, and outputs the generated signal as output signal 40. CML buffer 35 adjusts the level of output signal 40 from CMOS SSB mixer 34 and outputs the level-adjusted signal to another circuit.

4 Claims, 14 Drawing Sheets

U.S. PATENT DOCUMENTS 6,995,619 B2 * 2/2006 Cho .......................... 331/45
2005/0255822 A1 * 11/2005 Friedrich et al. ............ 455/323

FOREIGN PATENT DOCUMENTS

| JP | 2001-273048 A |   | 10/2001 |
|----|---------------|---|---------|
| JP | 2002-163034 A |   | 6/2002  |
| JP | 2002232314 A  | * | 8/2002  |
| JP | 2003-198329 A |   | 7/2003  |
| JP | 2003-258666 A |   | 9/2003  |
| JP | 2005-051732 A |   | 2/2005  |
| JP | 2005-175698 A |   | 6/2005  |

OTHER PUBLICATIONS

C. Sandner et al., "A 3GHz to 7GHz Fast-Hopping Frequency Synthesizer for UWB", International Workshop on UWB Technologies, May 21, 2004, pp. 405-409.

K. Yamaguchi et al., "A 2.5-GHz Four-Phase Clock Generator With Scalable No-Feedback-Loop Architecture", IEEE Journal of Solid-State Circuits, vol. 36, No. 11, Nov. 2001, pp. 1666-1672.

A. Hajimiri et al., "Design Issues in CMOS Differential LC Oscillators", IEEE Journal of Solid-State Circuits, vol. 34, No. 5, May 1999, pp. 717-724.

International Search Report of PCT/JP2006/314553 filed Jul. 24, 2006, date of mailing Oct. 24, 2006.

* cited by examiner

FREQUENCY SYNTHESIZER HAVING IMPROVED FREQUENCY HOPPING

TECHNICAL FIELD

The present invention relates to a frequency synthesizer as a circuit for synthesizing frequencies to generate any desired frequency, and more particularly to a frequency synthesizer for use in a frequency hopping scheme which is capable of high-rate switching of frequencies.

BACKGROUND ART

Frequency synthesizers capable of synthesizing various frequencies are widely used in wireless communication systems. If such a frequency synthesizer is used in a frequency hopping spread spectrum application, then it is required to perform high-rate switching of frequencies.

Heretofore, there has been used a frequency synthesizer for use in a frequency hopping scheme which is capable of switching high-frequency clock frequencies based on high-rate frequency hopping, as shown in Non-patent document 1, page 405, FIG. 1.

FIG. 26 is a diagram showing an example of a circuit arrangement of a frequency synthesizer of the related art. The frequency synthesizer of the related art comprises VCOs (Voltage-Controlled Oscillators) 1, 2, frequency dividers 3, 4, CML (Current Mode Logic) selector 5, CML SSB (Single Side Band) mixer 6, and CML buffer 7.

Operation of the frequency synthesizer of the related art shown in FIG. 26 will be described below. VCOs 1, 2 generate and output respective differential signals having different frequencies. Frequency dividers 3, 4 frequency-divide the respective output signals from VCOs 1, 2 by half, and output the frequency-divided signals to CML selector 5. The output signals from frequency dividers 3, 4 are four-phase signals (signals having phases of 0°, 90°, 180°, and 270°).

CML selector 5 selects either one of the two signals input from frequency dividers 3, 4, and outputs the selected signal to CML SSB mixer 6. CML SSB mixer 6 is supplied with the output signal from CML selector 5 and input signal 13, and outputs output signal 14. The frequency of output signal 14 is represented by the sum of, or the difference between, the frequency of output signal 12 from CML selector 5 and the frequency of input signal 13. Input signal 13 is also a four-phase signal is the output signal from CML selector 5.

Finally, output signal 14 from CML SSB mixer 6 is supplied to CML buffer 7, which adjusts the gain of the signal and generates signal 15 that is transmitted to another circuit.

The frequency synthesizer of the related art shown in FIG. 26 is capable of high-rate switching of frequencies by switching between the signals to be selected by CML selector 5.

The frequency synthesizer of the related art, however, is problematic in that since frequency dividers 3, 4 generate the four-phase signals by frequency-dividing the high-frequency signals generated by VCOs 1, 2, the frequency synthesizer has a high power consumption rate because of VCOs 1, 2 which operate at high frequencies.

The frequency synthesizer of the related art is also disadvantageous in that because its CML circuits use signals having small signal amplitudes, the SN ratio (signal to noise ratio) of the generated signals is small.

Generally, frequency synthesizers are required to operate at a lower voltage since the frequency generated thereby is higher. Specifically, a small 90 nm CMOS process required to achieve 100 GHz operation needs to operate at a power supply voltage of 1 V or lower. However, inasmuch as the frequency synthesizer of the required art comprises CML circuits, it has an increased number of cascaded MOS transistors and cannot be operated at a low voltage.

Non-patent document 1: Christoph Sandner et al., "A 3 GHz to 7 GHz Fast-Hopping Frequency Synthesizer for UWB", IWUWBT (International Workshop on UWB Technologies) 2004, p. 405-409.

DISCLOSURE OF THE INVENTION

Problems to be Solved by the Invention

The frequency synthesizer of the related art described above has suffered the following problems:

(1) The frequency synthesizer has a high power consumption rate because it has circuits that operate at high frequencies.

(2) Since the frequency synthesizer comprises CML circuits, the SN ratio is small and the frequency synthesizer cannot be operated at a low voltage.

It is an object of the present invention to provide a frequency synthesizer which is capable of reducing power consumption and increasing the SN ratio. Another object of the present invention is to provide a frequency synthesizer which is capable of fast hopping, has an ultra-wide frequency range, and is capable of operating at a low voltage.

Means for Solving the Problems

To achieve the above object, a frequency synthesizer according to the present invention includes first and second CMOS quadrature voltage-controlled oscillators for generating four-phase signals, a CMOS selector for selecting either one of the two four-phase signals generated by the first and second CMOS quadrature voltage-controlled oscillators, a CMOS SSB mixer for multiplying the four-phase signal selected by the CMOS selector by a four-phase input signal input from an external source to generate and output a signal having a frequency represented by the sum of, or the difference between, the frequency of the four-phase signal and the frequency of the four-phase input signal, and a CML buffer for adjusting the level of the output signal from the CMOS SSB mixer and outputting the adjusted signal to another circuit.

Since the frequency synthesizer according to the present invention employs CMOS quadrature voltage-controlled oscillators, the operating frequency thereof is half the frequency of general voltage-controlled oscillators, and no frequency dividers are required. With the operating frequency being lowered, it is possible to use a CMOS selector which has a slower operating frequency than a CML selector, but has reduced power consumption. Since a signal having a CMOS level is used rather than a signal having a CML level, the signal amplitude is increased. Because CMOS circuits are used, the number of cascaded transistors is reduced for operation at a low voltage.

Another frequency synthesizer according to the present invention includes a CMOS quadrature voltage-controlled oscillator for generating a four-phase signal, a frequency divider for frequency-dividing the four-phase signal generated by the CMOS quadrature voltage-controlled oscillator, a CMOS selector for selecting either one of the two four-phase signals generated by the CMOS quadrature voltage-controlled oscillator and the four-phase signal frequency-divided by the frequency divider, a CMOS SSB mixer for multiplying the four-phase signal selected by the CMOS selector by a four-phase input signal input from an external source to generate and output a signal having a frequency represented by the sum of, or the difference between, the frequency of the four-phase signal and the frequency of the four-phase input signal, and a CML buffer for adjusting the level of the output signal from the CMOS SSB mixer and outputting the adjusted signal to another circuit.

According to the present invention, the frequency divider frequency-divides the four-phase signal generated by the CMOS quadrature voltage-controlled oscillator, and the CMOS selector selects either one of the two four-phase signals. The frequency synthesizer includes only one CMOS quadrature voltage-controlled oscillator, and hence is of a simple circuit arrangement.

The frequency divider may include a filter disposed between the CMOS SSB mixer and the CML buffer, the filter having a switchable cutoff frequency, or the CML buffer may include a filter having a switchable cutoff frequency.

According to the present invention, the SN ratio can further be increased because spurious power generated by the mixer as unwanted noise is reduced by the filter having a switchable cutoff frequency.

Advantages of the Invention

As described above, since the frequency synthesizer according to the present invention employs CMOS quadrature VCOs and incorporates CMOS circuits, the frequency synthesizer has reduced power consumption and a high SN ratio.

Figure 1:
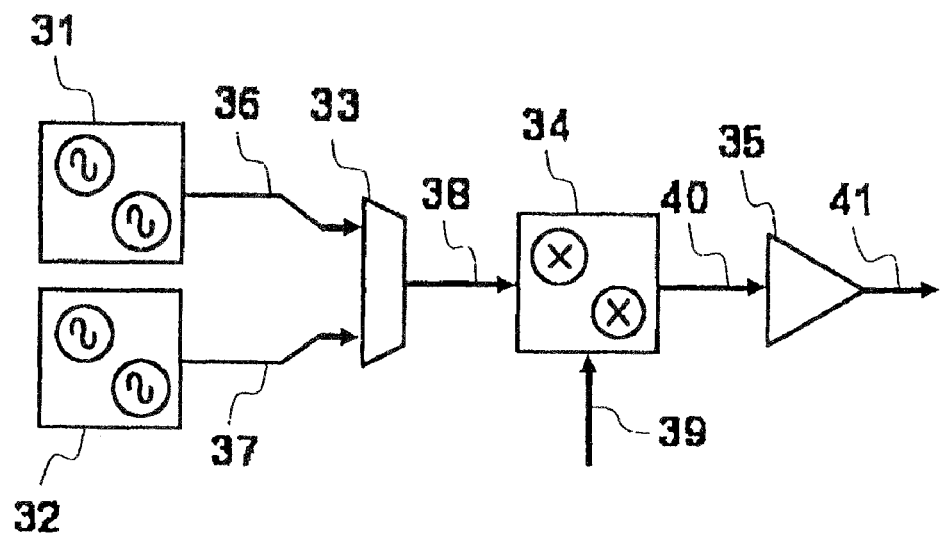
FIG. 1 is a block diagram showing an arrangement of a frequency synthesizer according to a first exemplary embodiment of the present invention.

DESCRIPTION OF REFERENCE CHARACTERS 1, 2 VCO
3, 4 frequency divider
5 CML selector
6 CML SSB mixer
7 CML buffer
13 input signal
14, 15 output signal
31, 32 CMOS quadrature VCO
33 CMOS selector
34 CMOS SSB mixer
35 CML buffer
36, 37 four-phase clock signal
38 four-phase output signal
39 four-phase input signal
40, 41 output signal
60, 61 inductor
82 frequency divider
86 four-phase output signal 88 four-phase output signal
105 filter
112 output signal
125 CML buffer
131 output signal
141 fast-frequency-variable CMOS quadrature VCO
144 four-phase output signal
161 CMOS eight-phase VCO
162 harmonics-frequency-variable CMOS SSB mixer
164 eight-phase signal
166 output signal
185 two-phase differential signal
186 output signal
202 phase correcting circuit (MPC)
206 corrected eight-phase signal
232, 233 well
301, 302 differential LC-VCO (D-LC-VCO)
303 control terminal
304-307 input/output signal
321, 322 CMOS inverter
323, 324 CMOS inverter 323, 324
325 inductor
326, 327 varactor diode (variable-capacitance diode)
328, 329 differential input terminal
330, 331 differential output terminal
332 control terminal
340, 341 NAND circuit
342, 343 CMOS inverter with nMOS switch
344, 345 input terminal
346 output terminal
347 input terminal
361, 362 first differential pair
363, 364 second differential pair
365, 366 third differential pair
367, 368 fourth differential pair
369, 370 load resistor
371, 372 switched capacitor
373-376 source terminal
401, 402 buffer differential pair
404, 405 replica differential pair
403 buffer current source
406 replica current source
407, 408 buffer load resistor
409, 410 replica load resistor
411, 412 inductor
413 operational amplifier
414, 415 input terminal
416, 417 output terminal
418 inverting input terminal
421-427 nMOS transistor
428-434 nMOS transistor
435-438 inverter
439, 440 differential input signal terminal
441-444 four-phase output signal terminal
451-453 inductor
454-456 switch
457 terminal
478, 479 switched capacitor
501, 502 switched VCO
503, 504 control terminal
505 output terminal
521, 522 inductor terminal
523, 524 capacitor
545, 526 switched inverter
527, 528 switched two-step inverter
529, 530 output terminal
551-558 nMOS transistor differential pair 559-562 EXOR (exclusive-OR) circuit
563-566 selector
567-573 input terminal
574, 575 output terminal
591-594 four-phase phase correcting circuit
595-600 input terminal
601-604 output terminal
701, 702 input terminal
703 output terminal
704, 705 capacitor
706-709 switch
710 bias voltage generating circuit
806 CML buffer
811 CML level signal
905, 906 gain-variable CML buffer
911 output signal
913 output signal

BEST MODE FOR CARRYING OUT THE INVENTION

Exemplary embodiments of the present invention will be described in detail below with reference to the drawings.

1st Exemplary Embodiment

FIG. 1 is a block diagram showing an arrangement of a frequency synthesizer according to a first exemplary embodiment of the present invention. As shown in FIG. 1, the frequency synthesizer according to the present exemplary embodiment comprises CMOS quadrature VCOs 31, 32, CMOS selector 33, CMOS SSB mixer 34, and CML buffer 35 for gain adjustment. Four-phase input signal 39 has a CML (Current Mode Logic) level which is of a lower rate than four-phase output signal 38 from CMOS selector 33. Specifically, four-phase output signal 38 comprises a high-frequency signal in the range from 4 to 8 GHz, and quadrature input signal 39 comprises a low-frequency signal in the range from several hundreds MHz to 2 GHz.

CMOS quadrature VCOs 31, 32 generate and output respective four-phase signals 36, 37. CMOS selector 33 selects either one of two four-phase signals 36, 37 generated by CMOS quadrature VCOs 31, 32 and outputs the selected signal as output signal 38.

CMOS SSB mixer 34 multiplies output signal 38 selected by CMOS selector 33 and four-phase input signal 39 input from an external source by each other to generate a signal having a frequency represented by the sum of, or the difference between, the frequency of output signal 38 and the frequency of four-phase input signal 39, and outputs the generated signal as output signal 40.

CML buffer 35 is a buffer circuit for adjusting the level of output signal 40 from CMOS SSB mixer 34 and outputting the level-adjusted signal to another circuit.

Structural details of CMOS quadrature VCOs 31, 32 shown in FIG. 1 will be described below with reference to FIGS. 2 and 3.

Figure 2:
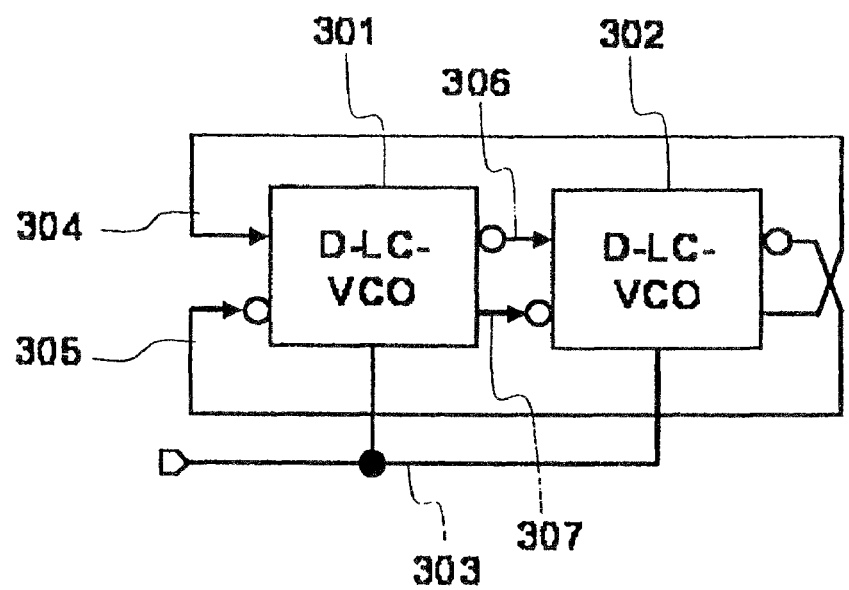
FIG. 2 is a block diagram showing an arrangement of CMOS quadrature VCOs 31, 32 according to the first exemplary embodiment of the present invention.

FIG. 2 is a block diagram showing an arrangement of CMOS quadrature VCOs 31, 32 shown in FIG. 1 which are constructed of LC-VCOs employing LC oscillating circuits.

As shown in FIG. 2, CMOS quadrature VCOs 31, 32 are implemented by coupling input and output signals 304 through 307 of two differential LC-VCOs 301, 302. Two differential LC-VCOs 301, 302 have common frequency control terminal 303.

A specific circuit of differential LC-VCOs 301, 302 in the block diagram of the CMOS quadrature VCOs shown in FIG.

Figure 3:
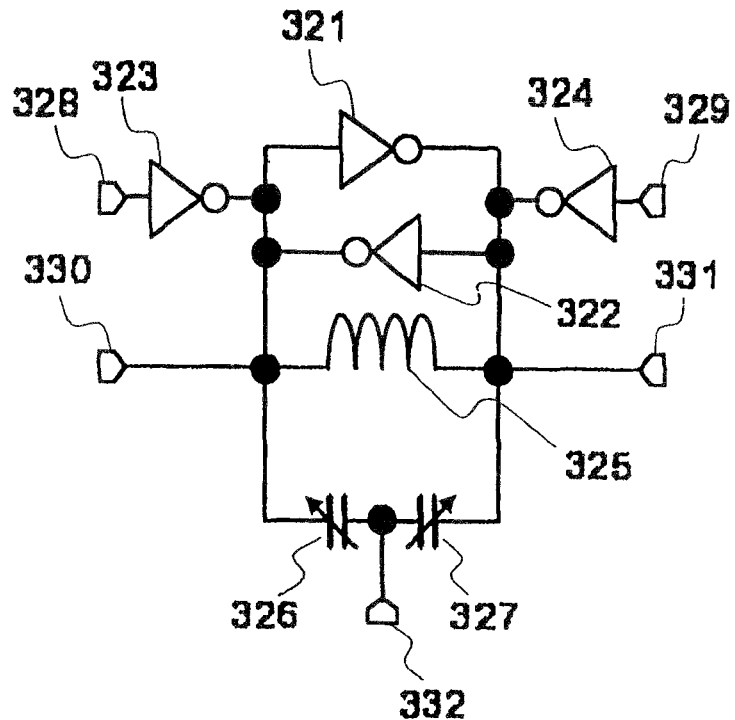
FIG. 3 is a diagram showing a specific circuit arrangement of a differential LC-VCO in the block diagram of the CMOS quadrature VCOs shown in FIG. 2.

2 is illustrated in FIG. 3. As shown in FIG. 3, differential LC-VCOs 301, 302 shown in FIG. 2 comprise cross-coupled CMOS inverters 321, 322, inductor 325, capacitance-variable varactor (variable-capacitance diodes) 326, 327, and CMOS inverters 323, 324 connected between differential input terminals 328, 329 and differential output terminals 330, 331. Control terminal 332 is identical to control terminal 303, input terminal 328 to input terminal 304 of differential LC-VCO 301, input terminal 329 to input terminal 305, differential output terminal 330 to output terminal 306, and differential output terminal 331 to output terminal 307.

Figure 4:
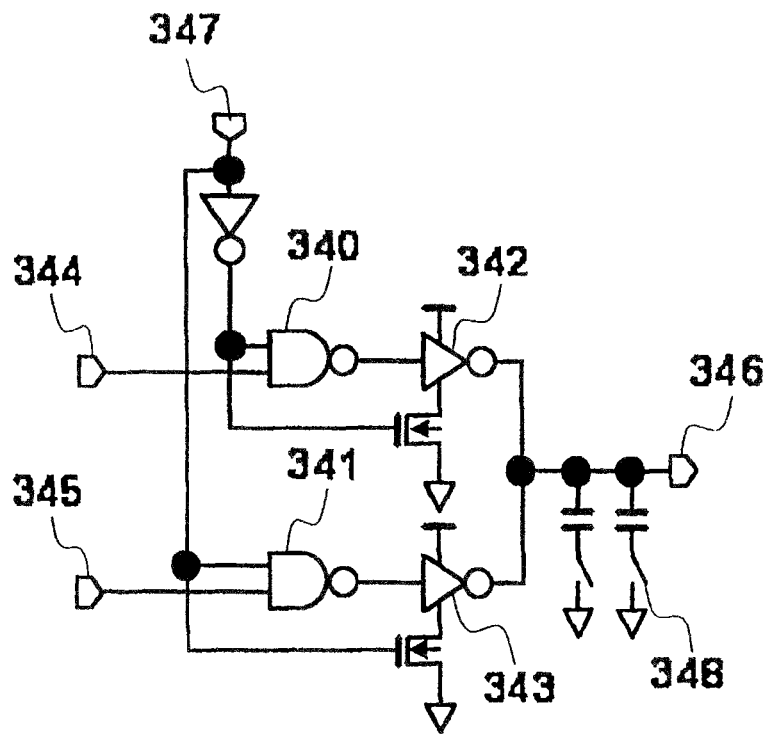
FIG. 4 is a diagram showing a specific circuit arrangement of CMOS selector 33 according to the first exemplary embodiment of the present invention.

An arrangement of CMOS selector 33 shown in FIG. 1 which is implemented by logic circuits is illustrated in FIG. 4. As shown in FIG. 4, CMOS selector 33 comprises NAND circuits 340, 341 and CMOS inverters 342, 343 with nMOS switches. NAND circuit 341 is supplied with a signal from input terminal 347, and NAND circuit 340 is supplied with an inverted signal of the input signal from input terminal 347. Input terminals 344, 345 are supplied with the signals from CMOS quadrature VCOs 31, 32 shown in FIG. 1. Output terminal 346 outputs the selected signal.

Figure 5:
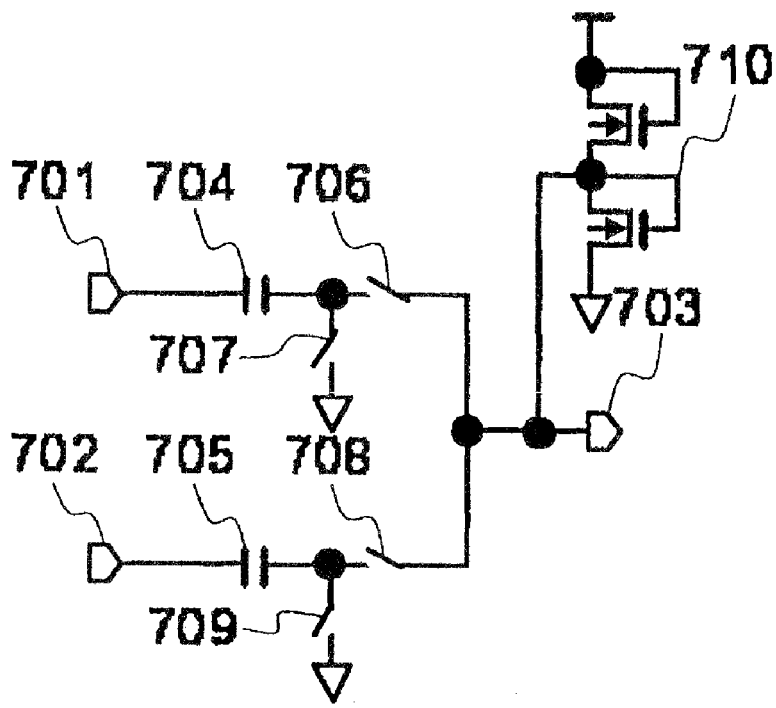
FIG. 5 is a diagram showing another specific circuit arrangement of CMOS selector 33 according to the first exemplary embodiment of the present invention.

An arrangement of CMOS selector 33 shown in FIG. 1 which is implemented using AC couplings is illustrated in FIG. 5. CMOS selector 33 comprises switches 706 through 709, capacitors 704, 705, and bias voltage generating circuit 710. Input terminals 701, 702 are supplied with the signals from CMOS quadrature VCOs 31, 32 shown in FIG. 1. Output terminal 703 outputs the selected signal as four-phase output signal 38 to CMOS SSB mixer 34.

Figure 6:
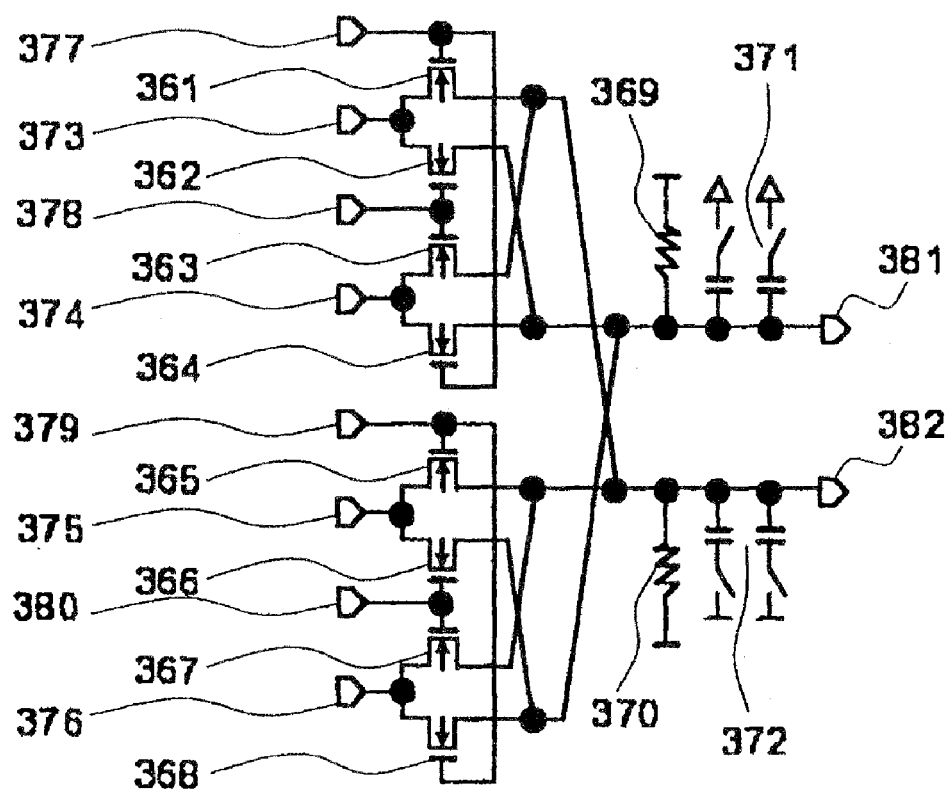
FIG. 6 is a diagram showing a specific circuit arrangement of CMOS SSB mixer 34 according to the first exemplary embodiment of the present invention.

A circuit arrangement of CMOS SSB mixer 34 shown in FIG. 1 is illustrated in FIG. 6. As shown in FIG. 6, CMOS SSB mixer 34 comprises first differential pair 361, 362, second differential pair 363, 364, third differential pair 365, 366, fourth differential pair 367, 368, load resistors 369, 370, and switched capacitors 371, 372. Differential pairs 361 through 368 have source terminals 373 through 376 supplied with four-phase output signal 38 from CMOS selector 33, and gate terminals 377 through 380 supplied with four-phase input signal 39.

Figure 7:
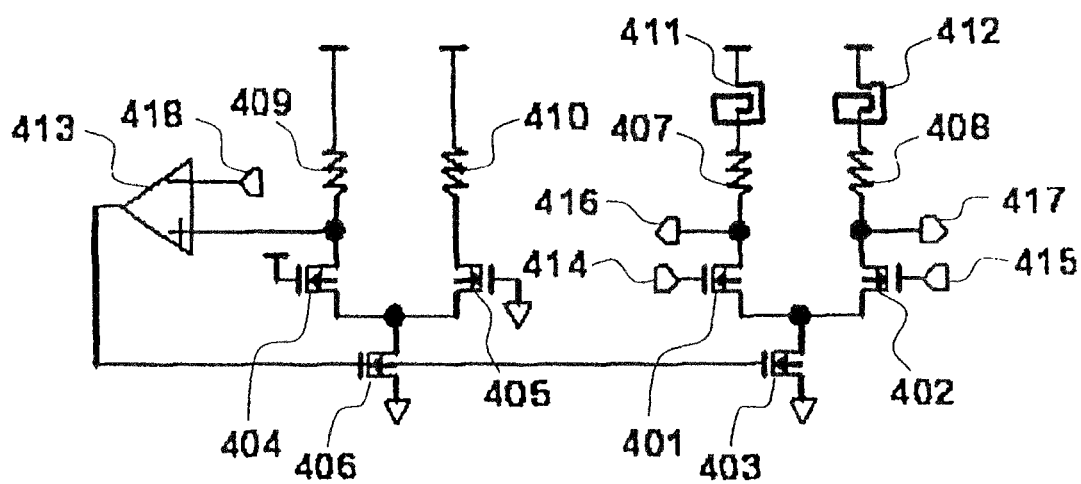
FIG. 7 is a diagram showing a specific circuit arrangement of CML buffer 35 according to the first exemplary embodiment of the present invention.

A circuit arrangement of CML buffer 41 shown in FIG. 1 is illustrated in FIG. 7. As shown in FIG. 7, CML buffer 41 comprises buffer differential pair 401, 402, replica differential pair 404, 405, buffer current source 403, replica current source 406, buffer load resistors 407, 408, replica load resistors 409, 410, inductors 411, 412, and operational amplifier 413. Input terminals 414, 415 are supplied with input signal 40, output terminals 416, 417 supply output signal 41. An external reference voltage is applied to inverting input terminal 418 of operational amplifier 413. CML buffer 35 and its replica have their respective transistor sizes which are identical to each other or one of which is a constant multiple of the other, and have their respective resistance values which are identical to each other or one of which is a constant division of the other.

Operation of the frequency synthesizer according to the present exemplary embodiment will be described in detail below with reference to the drawings.

In FIG. 1, quadrature VCOs 31, 32 generate four-phase clock signals 36, 37 at a four-phase CMOS level which have different frequencies. CMOS selector 33 selects either one of two four-phase clock signals 36, 37 output from quadrature VCOs 31, 32, and outputs the selected signal at a CMOS level. CMOS SSB mixer 34 outputs signal 40 having a frequency represented by the sum of, or the difference between, the frequency of four-phase output signal 38 from CMOS selector 33 and the frequency of four-phase input signal 39. CML buffer 35 transmits output signal 40 from CMOS SSB mixer 34 to another circuit. By switching between the frequencies of four-phase output signal 38 from CMOS selector 33, the frequency of output signal 41 is quickly switched. At this time, as spurious components are generated in a desired RF signal band by harmonics of a low-frequency signal, the low-frequency signal can reduce harmonics power according to the CML circuits. Generally, CML circuits consume a greater current than CMOS circuits, but have a small consumption current as they handle a low-frequency signal. Conversely, if spurious components are generated outside of the RF signal band by harmonics of a high-frequency signal, then circuits that require high harmonic power requirement, such as CMOS circuits, can be used.

The CMOS level referred to above may represent not only a signal which fully swings from a ground potential to a power supply potential, but also a signal which swings from about 20% to 80%, for example, which makes possible the advantages of the present invention. The low power consumption is provided because no steady bias current flows. When the signal swings from about 20% to 80%, it produces a large signal amplitude with respect to the CML level. The CML level normally has an amplitude that ranges from about ½ to ⅓ of the power supply voltage. The CML circuits (CML level) are characterized in that they consume a steady bias current, but can transmit signals at a high rate with small distortions.

In FIG. 3, the signals at differential output terminals 330, 331 are differential CMOS signals because of the resonance of inductor 325 and varactor diodes 326, 327 and a load resistor provided by cross-coupled CMOS inverters 321, 322. In FIG. 1, since the phase relationship is determined by the coupled input and output terminals of differential LC-VCOs 301, 302, CMOS four-phase signals including 0° signal 304, 90° signal 307, 180° signal 305, and 270° signal 306 are generated.

In FIG. 4, when the state of selector signal 347 goes to a high level (hereinafter referred to as "H level"), the output state of NAND circuit 340 is held at a H level at all times, and NAND circuit 341 outputs an inverted signal of input signal 345. At this time, the output impedance of CMOS inverter 342 with an nMOS switch becomes high, and CMOS inverter 342 with an nMOS switch outputs an inverted signal of the output signal from NAND circuit 341 to output terminal 346.

In FIG. 5, switch 706 and switch 707, and switch 708 and switch 709 operate complementarily to each other. Since switch 706 and switch 708 also operate complementarily to each other, input signal 701 or input signal 702 from the switch that is turned on is output to output terminal 703. Conversely, the end of the capacitor which is connected to the switch that is turned off is connected to GND, providing a low impedance to reduce the leakage of the input signal to output terminal 703. If the voltage generated by bias voltage generating circuit 710 is set to a CMOS-level threshold voltage, then the signal can be transmitted to CMOS SSB mixer 34 at the next stage.

In FIG. 6, when the states of CMOS input signals supplied to source terminals 373 through 376 reach H level, differential pairs 361 through 368 are turned off. Conversely, when the states of CMOS input signals supplied to source terminals 373 through 376 reach low level (hereinafter referred to as "L level"), differential pairs 361 through 368 are turned on. Differential pairs 361 through 368 convert signals 377 through 380 applied to the gate terminals into currents, which are converted by load resistors 369, 370 into voltages as output signals. At this time, since output signals 381, 382 represent the products of the input signals applied to source terminals 373 through 376 and the input signals applied to gate terminals 377 through 380, the frequencies of the output signals becomes sum frequencies, or differential frequencies. When the switches are turned on or off depending on the switching of the frequencies of output signals 381, 382 or the switching of the frequencies of the signals applied to source terminals 373 through 376, the capacitance values of switched capacitors 371, 372 are switched. The cutoff frequencies of output signals 381, 382 are thus switched to reduce spurious power. Specifically, if frequencies of 4 GHz and 1 GHz are synthesized by a mixer, then harmonics power of 8 GHz (twice 4 GHz) or higher is reduced. If frequencies of 8 GHz and 1 GHz are synthesized, a signal of 8 GHz is output without being reduced by turning off the filter. Since the circuit operates in a quasi-differential mode, though it is in the CMOS level, it is less susceptible to disturbance such as substrate noise or the like.

For ultra-wideband communications typified by UWB (Ultra-Wideband), the above frequency switching needs to be performed in order to cover a wide frequency range from 3 to 10 GHz, for example. According to the multiband OFDM (Orthogonal Frequency Division Multiplexing) standards, there are 14 subbands in the range from 3.1 to 10.6 GHz. In addition, it is necessary to perform fast hopping between three consecutive subbands at intervals of about 10 ns. Depending on the switching of the 14 subbands, the cutoff frequencies are switched to reduce harmonic power for thereby attenuating harmonics without attenuating the fundamental frequency. In other words, there is provided a synthesizer having a flat fundamental signal level and low spurious power in a wide frequency range from 3 to 10 GHz.

In FIG. 7, input signals 414, 415 are amplified into output signals 416, 417. The replica circuit of CML buffer 335 and operational amplifier 413 control the common mode voltage of the CML buffer.

The frequency synthesizer according to the present exemplary embodiment employs CMOS quadrature VCOs 31, 32 to lower the operating frequency. Therefore, CML circuits can be replaced with CMOS circuits, and the frequency divider used to generate four-phase signals is no longer required. The frequency synthesizer is of low power consumption.

Since a CMOS circuit comprises two stages of a PMOS transistor and an NMOS transistor, the number of cascaded transistors is reduced. The CMOS circuit can thus produce a signal amplitude which is identical or essentially equal to the power supply voltage. Stated otherwise, since a CMOS level can provide a large amplitude compared with the small amplitude of a CML level, it is possible to provide a frequency synthesizer having a high SN ratio by employing CMOS circuits.

As the number of cascaded transistors is reduced, the CMOS circuit can operate at a low voltage, making it possible to provide a frequency synthesizer fabricated by a microfabrication process for use in an ultra-wideband of 10 GHz.

2nd Exemplary Embodiment

A second exemplary embodiment of the present invention will be described in detail below with reference to the drawings.

Figure 8:
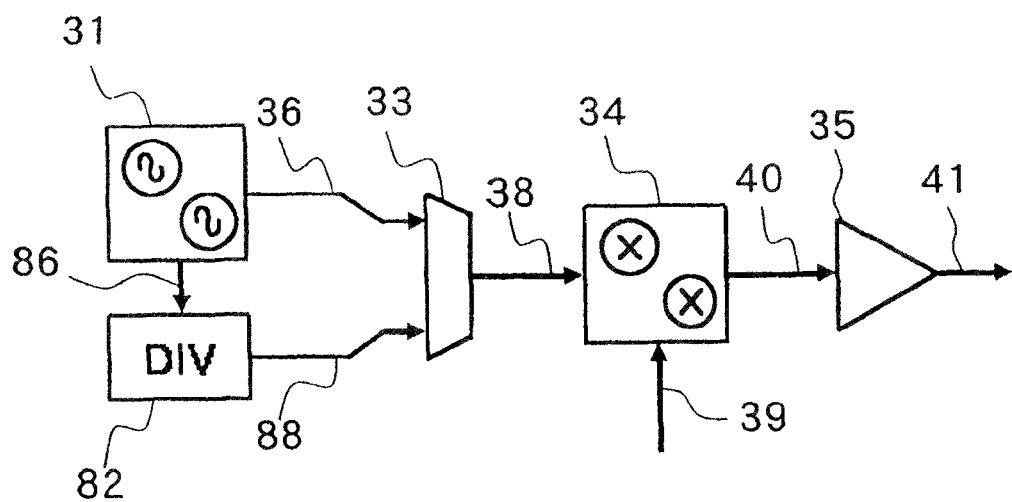
FIG. 8 is a block diagram showing an arrangement of a frequency synthesizer according to a second exemplary embodiment of the present invention.

FIG. 8 is a block diagram showing an overall arrangement of a frequency synthesizer according to a second exemplary embodiment of the present invention. Those components shown in FIG. 8 which are identical to those shown in FIG. 1 are denoted by identical reference characters, and will not be described below.

As shown in FIG. 8, the frequency synthesizer according to the present exemplary embodiment comprises CMOS quadrature VCO 31, frequency divider (DIV) 82, CMOS selector 33, CMOS SSB mixer 34, and CML buffer 35. The frequency synthesizer according to the present exemplary embodiment differs from the frequency synthesizer according to the first exemplary embodiment shown in FIG. 1 in that CMOS quadrature VCO 32 is replaced with frequency divider 82.

In the frequency synthesizer according to the present exemplary embodiment, frequency divider 82 is supplied with four-phase output signal 86 from CMOS quadrature VCO 31, frequency-divides four-phase output signal 86 into four-phase output signal 88, and inputs four-phase output signal 88 to CMOS selector 33.

Figure 9:
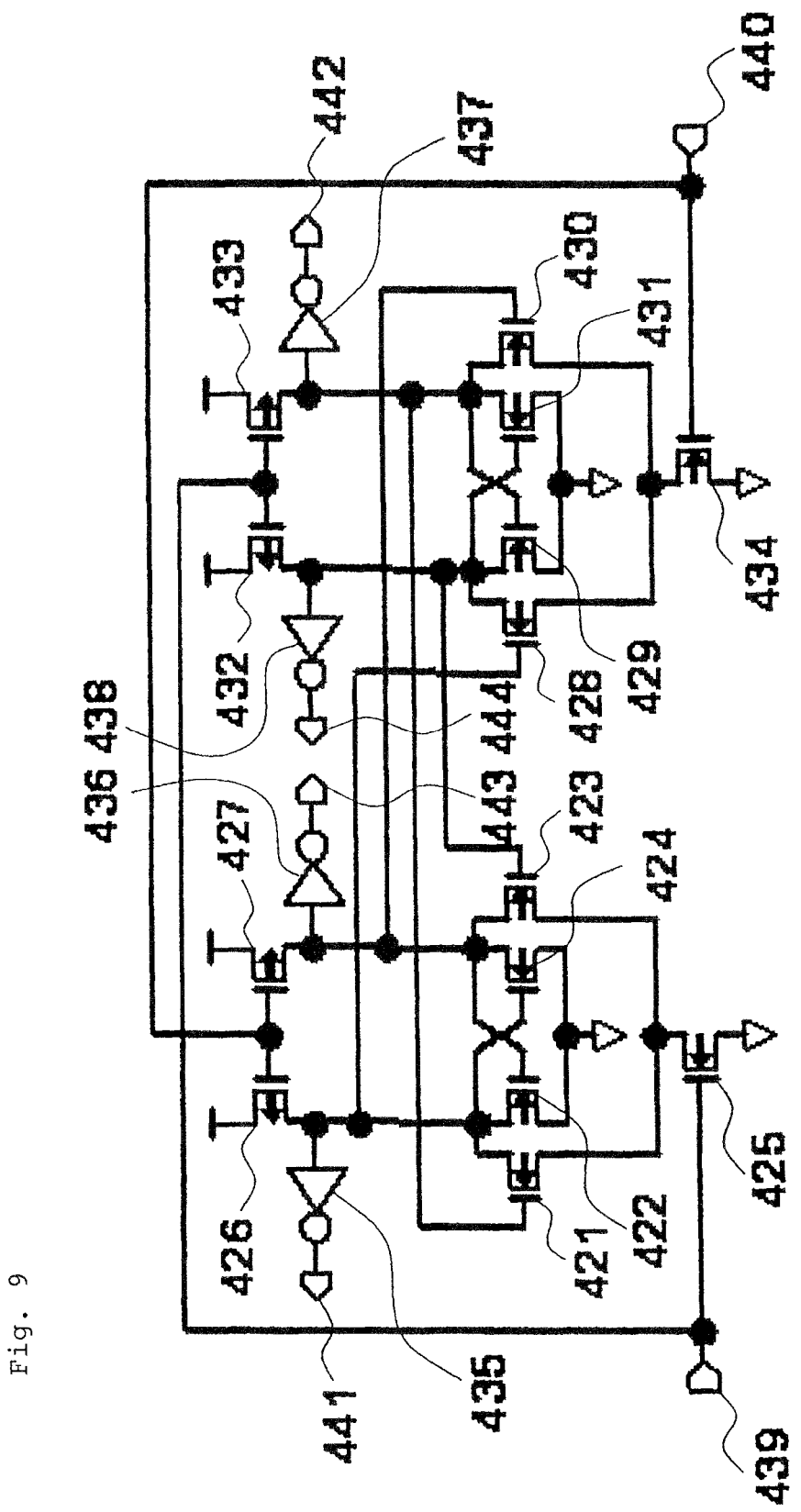
FIG. 9 is a diagram showing a specific circuit arrangement of frequency divider 85 according to the second exemplary embodiment of the present invention.

Circuit details of frequency divider 82 shown in FIG. 8 will be described below with reference to FIG. 9. As shown in FIG. 9, frequency divider 82 includes a latch circuit comprising nMOS transistors 421 through 427 and another latch circuit comprising nMOS transistors 428 through 434. These latch circuits have output terminals connected to inverters 435 through 438. Frequency divider 82 includes differential input signal terminals 439, 440 and four-phase output signal terminals 441 through 444.

Operation of the frequency synthesizer according to the present exemplary embodiment will be described in detail below with reference to the drawings.

In FIG. 8, frequency divider 82 outputs four-phase signal 88 which is generated when frequency divider 82 frequency-divides four-phase output signal 86 input from CMOS quadrature VCO 31. Four-phase signal 88 is a CMOS-level signal. Either one of four-phase signal 88 and four-phase output signal 86 from CMOS quadrature VCO 31 is selected by CMOS selector circuit 33.

In FIG. 9, when the state of the latch circuits changes from an L level to an H level or from an H level to an L level upon transition of the same state of differential input signals 439, 440, the frequency thereof becomes one-half of the frequency of the input signals. The signals are converted into a CMOS level by the inverters, and output as four-phase signals 441 through 444.

According to the present exemplary embodiment, the frequency synthesizer includes only one CMOS quadrature VCO 31, and hence is of a simple circuit arrangement.

3rd Exemplary Embodiment

A third exemplary embodiment of the present invention will be described in detail below with reference to the drawings.

Figure 10:
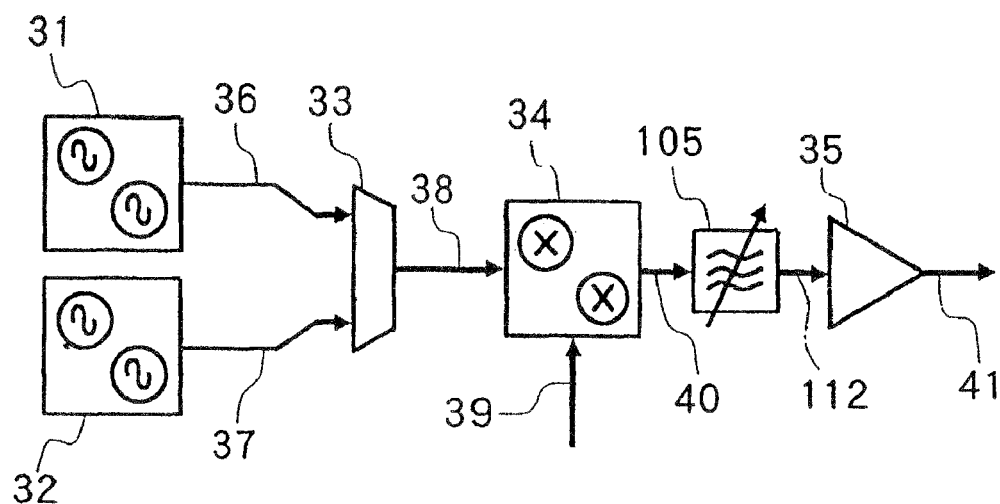
FIG. 10 is a block diagram showing an arrangement of a frequency synthesizer according to a third exemplary embodiment of the present invention.

FIG. 10 is a block diagram showing an overall arrangement of a frequency synthesizer according to a third exemplary embodiment of the present invention. Those components shown in FIG. 10 which are identical to those shown in FIG. 1 are denoted by identical reference characters, and will not be described below.

As shown in FIG. 10, the frequency synthesizer according to the present exemplary embodiment comprises CMOS quadrature VCOs 31, 32, CMOS selector 33, CMOS SSB mixer 34, filter 105, and CML buffer 35. The frequency synthesizer according to the present exemplary embodiment differs from the frequency synthesizer according to the first exemplary embodiment shown in FIG. 1 in that filter 105 with a variable cutoff frequency is disposed between the output terminal of CMOS SSB mixer 34 and the input terminal of CML buffer 35.

Filter 105 filters output signal 40 from CMOS SSB mixer 34 and outputs the filtered signal as output signal 112 to CML buffer 35.

Filter 105 has its cutoff frequency switchable in proportion to the frequency of output signal 40 from CMOS SSB mixer 34 to reduce spurious power contained in output signal 40 from CMOS SSB mixer 34. Therefore, the SN ratio of output signal 41 output from CML buffer 35 is improved.

Figure 11:
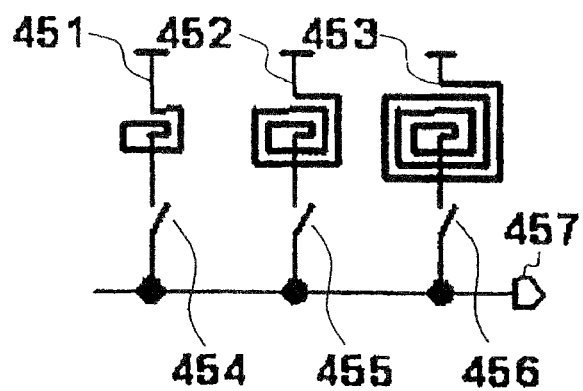
FIG. 11 is a diagram showing a specific circuit arrangement of filter 105 according to the third exemplary embodiment of the present invention.

FIG. 11 shows circuit details of filter 105 shown in FIG. 10. As shown in FIG. 11, filter 105 comprises a parallel-connected array of inductors 451 through 453 to which switches 454 through 456 are connected in series. Terminal 457 is connected to the output terminal of CMOS SSB mixer 34 and the input terminal of CML buffer 35.

Operation of the frequency synthesizer according to the present exemplary embodiment will be described in detail below with reference to the drawings.

In FIG. 11, when switches 454 through 456 connected to inductors 451 through 453 are turned on or off, the inductance values thereof as viewed from terminal 457 are switched. Based on the inductance values and the capacitance value of switched capacitors 371 through 372 shown in FIG. 6, the cutoff frequency of the filter is switched.

According to the present exemplary embodiment, since the spurious power can be reduced by filter 105 with the switchable cutoff frequency, the SN ratio of the generated signal can be further increased.

4th Exemplary Embodiment

A fourth exemplary embodiment of the present invention will be described in detail below with reference to the drawings.

Figure 12:
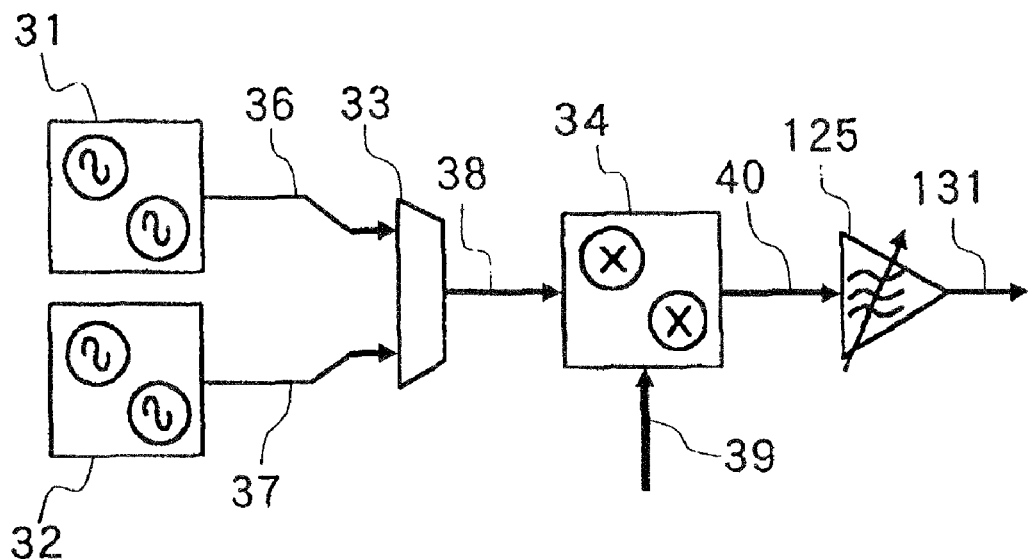
FIG. 12 is a block diagram showing an arrangement of a frequency synthesizer according to a fourth exemplary embodiment of the present invention.

FIG. 12 is a block diagram showing an overall arrangement of a frequency synthesizer according to a fourth exemplary embodiment of the present invention. Those components shown in FIG. 12 which are identical to those shown in FIG. 1 are denoted by identical reference characters, and will not be described below.

As shown in FIG. 12, the frequency synthesizer according to the present exemplary embodiment comprises CMOS quadrature VCOs 31, 32, CMOS selector 33, CMOS SSB mixer 34, and CML buffer 125 with a variable-cutoff-frequency filter function. The frequency synthesizer according to the present exemplary embodiment differs from the frequency synthesizer according to the first exemplary embodiment shown in FIG. 1 in that CML buffer 35 is replaced with CML buffer 125 with a variable-cutoff-frequency filter function.

CML buffer 125 according to the present exemplary embodiment filters output signal 40 from CMOS SSB mixer 34, adjusts the level of the signal, and outputs the level-adjusted signal as output signal 131 to another circuit. In other words, CML buffer 125 comprises a combination of CML buffer 35, shown in FIG. 1, and a filter with its cutoff frequency switchable.

CML buffer 125 according to the present exemplary embodiment has a function which is a combination of filter 105, shown in FIG. 10, and CML buffer 35. With the frequency synthesizer according to the present exemplary embodiment, the cutoff frequency of CML buffer 125 is switched in proportion to the frequency of output signal 40 from CMOS SSB mixer 34 to reduce spurious power contained in output signal 40 from CMOS SSB mixer 34.

Circuit details of CML buffer 125 will be described below with reference to FIG. 13. CML buffer 125 with the filter function according to the present exemplary embodiment is of an arrangement wherein switched capacitors 478, 479 are connected to respective output terminals 416, 417 of the arrangement shown in FIG. 7.

Figure 13:
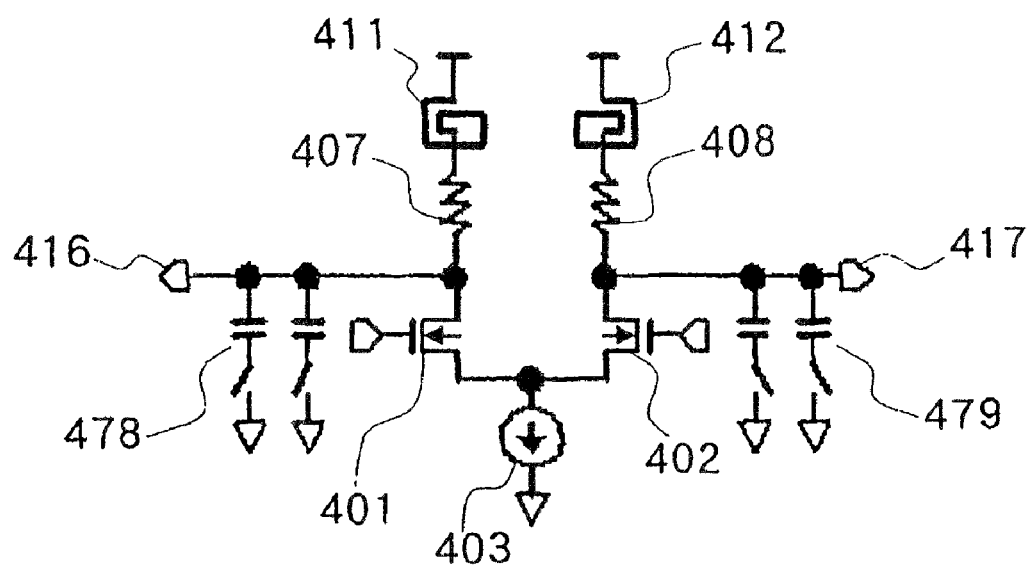
FIG. 13 is a diagram showing a specific circuit arrangement of CML buffer 125 with a filter function according to the fourth exemplary embodiment of the present invention.

With CML buffer 125 according to the present exemplary embodiment, when switched capacitors 478, 479 shown in FIG. 13 are turned on or off, the capacitance values as viewed from output terminals 416, 417 are switched. The cutoff frequency of CML buffer 125 is switched based on the capacitance values. The cutoff frequency may also be switched by using the switched inductors shown in FIG. 11.

The frequency synthesizer according to the present exemplary embodiment is capable of reducing spurious power by adding the filter function to CML buffer 125, rather than using independent filter 105 in the case of the frequency synthesizer according to the fourth exemplary embodiment shown in FIG. 10.

5th Exemplary Embodiment

A fifth exemplary embodiment of the present invention will be described in detail below with reference to the drawings.

Figure 14:
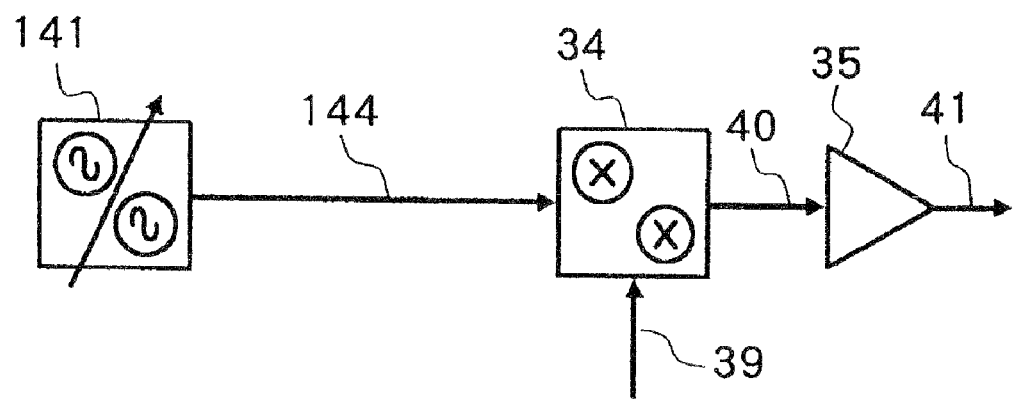
FIG. 14 is a block diagram showing an arrangement of a frequency synthesizer according to a fifth exemplary embodiment of the present invention.

FIG. 14 is a block diagram showing an overall arrangement of a frequency synthesizer according to a fifth exemplary embodiment of the present invention. Those components shown in FIG. 14 which are identical to those shown in FIG. 1 are denoted by identical reference characters, and will not be described below.

As shown in FIG. 14, the frequency synthesizer according to the present exemplary embodiment comprises fast frequency-variable CMOS quadrature VCO 141, CMOS SSB mixer 34, and CML buffer 35. The frequency synthesizer according to the present exemplary embodiment differs from the frequency synthesizer according to the first exemplary embodiment shown in FIG. 1 in that CMOS quadrature VCOs 31, 32 and CMOS selector 33 are replaced with fast frequency-variable CMOS quadrature VCO 141.

Fast frequency-variable CMOS quadrature VCO 141 according to the present exemplary embodiment outputs a signal capable of fast frequency switching as four-phase output signal 144 to CMOS SSB mixer 34. Specifically, fast frequency-variable CMOS quadrature VCO 141 is capable of quickly switching between two frequencies when it generates and outputs a four-phase signal.

In the frequency synthesizer according to the first exemplary embodiment shown in FIG. 1, CMOS selector 33 switches to change frequencies input to CMOS SSB mixer 34. In the frequency synthesizer according to the present exemplary embodiment shown in FIG. 14, fast frequency-variable CMOS quadrature VCO 141 has a wide frequency-variable range for switching frequencies input to CMOS SSB mixer 34.

Figure 15:
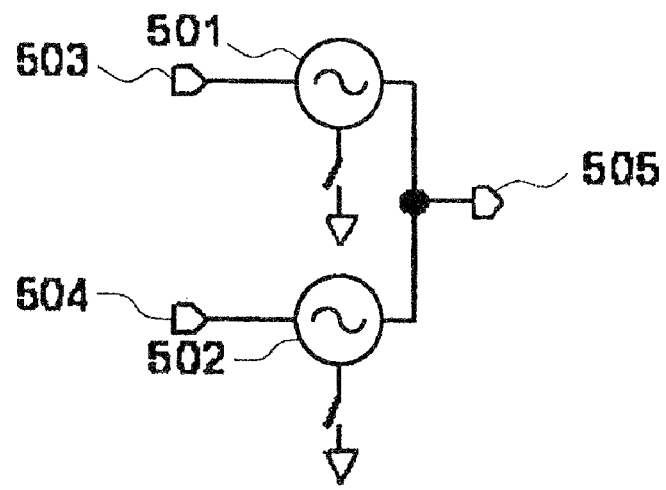
FIG. 15 is a diagram showing a specific circuit arrangement of fast-frequency-variable VCO 141 according to the fifth exemplary embodiment of the present invention.

Details of fast frequency-variable CMOS quadrature VCO 141 will be described below with reference to FIG. 15. As shown in FIG. 15, fast frequency-variable CMOS quadrature VCO 141 comprises switched VCOs 501, 502. Switched VCOs 501, 502 have output terminals 505 connected to each other. Control terminals 503, 504 are connected respectively to switched VCOs 501, 502.

Figure 16:
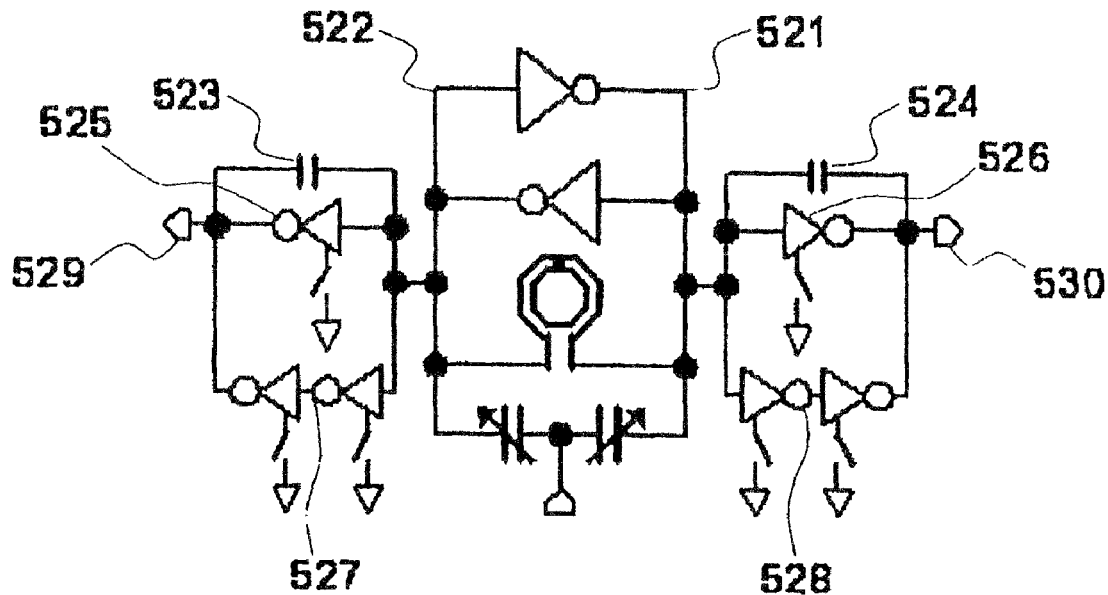
FIG. 16 is a diagram showing another specific circuit arrangement of fast-frequency-variable VCO 141 according to the fifth exemplary embodiment of the present invention.

FIG. 16 shows fast frequency-variable CMOS quadrature VCO 141 constructed as a fast frequency-variable LC-VCO. As shown in FIG. 16, fast frequency-variable CMOS quadrature VCO 141 comprises capacitors 523, 524, switched inverters 525, 526, and switched dual-stage inverters 527, 528 which are connected parallel to respective opposite terminals 521, 522 of an inductor. Capacitors 523, 524 and switched inverters 525, 526 which are connected parallel to each other have output terminals connected into output terminals 529, 530. The inverter may be replaced with a logic circuit for switching between the state of an input signal and the inverted state of the input signal.

In FIG. 15, when either one of switched VCOs 501, 502 is tuned on and off, the frequency of the signal output to output terminal 505 is switched. Fast frequency-variable CMOS quadrature VCO 141 is arranged such that the output impedance of the switched VCO which is turned off is high.

In FIG. 16, when single-stage inverters 525, 526 or dual-stage inverters 527, 528 are turned on and off, a mirror effect is caused in the capacitance values of capacitors 523, 524 for thereby greatly varying the oscillating frequency of the VCOs.

6th Exemplary Embodiment

A sixth exemplary embodiment of the present invention will be described in detail below with reference to the drawings.

Figure 17:
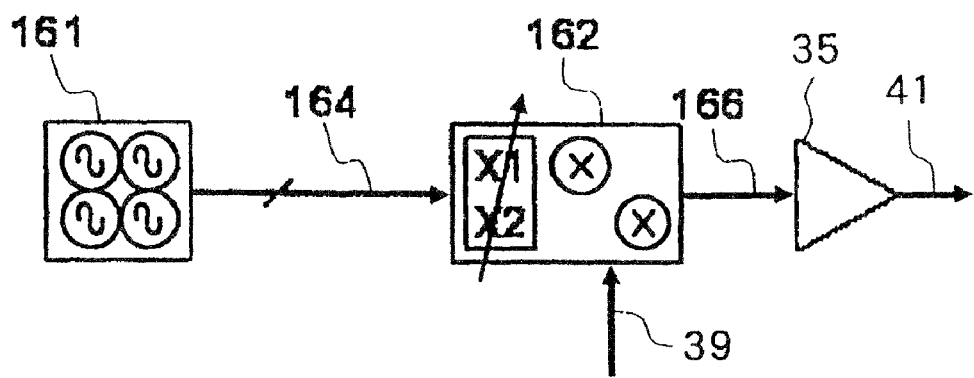
FIG. 17 is a block diagram showing an arrangement of a frequency synthesizer according to a sixth exemplary embodiment of the present invention.

FIG. 17 is a block diagram showing an overall arrangement of a frequency synthesizer according to a sixth exemplary embodiment of the present invention. Those components shown in FIG. 17 which are identical to those shown in FIG. 1 are denoted by identical reference characters, and will not be described below.

As shown in FIG. 17, the frequency synthesizer according to the present exemplary embodiment comprises CMOS eight-phase VCO 161, harmonics-frequency-variable CMOS SSB mixer 162, and CML buffer 35. The frequency synthesizer according to the present exemplary embodiment differs from the frequency synthesizer according to the first exemplary embodiment shown in FIG. 1 in that CMOS quadrature VCOs 31, 32 and CMOS selector 33 are replaced with CMOS eight-phase VCO 161, and CMOS SSB mixer 34 is replaced with harmonics-frequency-variable CMOS SSB mixer 162.

CMOS eight-phase VCO 161 generates and outputs eight-phase signals 164.

Harmonics-frequency-variable CMOS SSB mixer 162 is supplied with eight-phase signals 164 from CMOS eight-phase VCO 161 and four-phase input signal 39 input from an external source, generates a signal having a frequency which is the sum of, or the difference between, a frequency which is one or two times the frequency of eight-phase signals 164 and the frequency of four-phase input signal 39, and outputs the generated signal as output signal 166.

Figure 18:
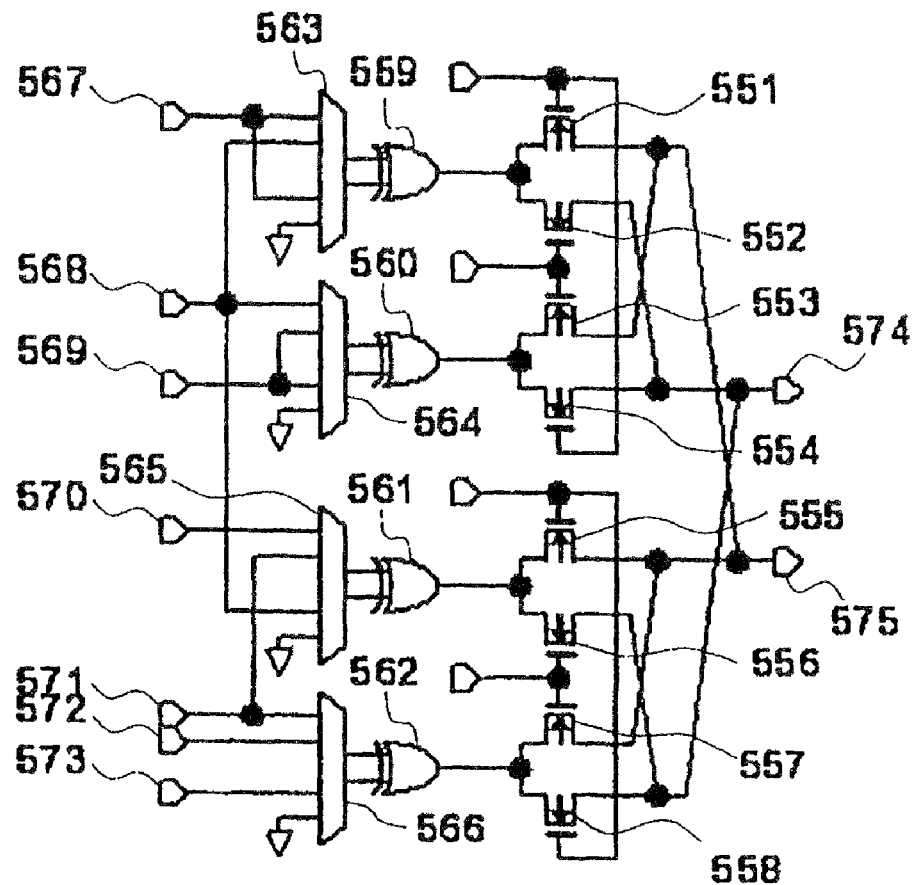
FIG. 18 is a diagram showing another specific circuit arrangement of harmonics-frequency-variable CMOS SSB mixer 162 according to the sixth exemplary embodiment of the present invention.

Details of harmonics-frequency-variable CMOS SSB mixer 162 will be described below with reference to FIG. 18. As shown in FIG. 18, harmonics-frequency-variable CMOS SSB mixer 162 comprises EXOR (exclusive-OR) circuits 559 through 562 connected to the source terminals of differential pairs 551 through 558 of nMOS transistors, and selectors 563 through 566 connected to the input terminals of EXOR circuits 559 through 562. The input terminals of selectors 563 through 566 are supplied with three-phase signals of eight-phase signals 164 input from input terminals 567 through 573 and with an L-level signal. A signal having a phase of 0° is input to input terminal 567, a signal having a phase of 90° to input terminal 568, a signal having a phase of 180° to input terminal 569, a signal having a phase of 45° to input terminal 570, a signal having a phase of 135° to input terminal 571, a signal having a phase of 225° to input terminal 572, and a signal having a phase of 270° to input terminal 563. Output terminals 574, 575 output output signal 166.

Operation of the frequency synthesizer according to the present exemplary embodiment will be described in detail below with reference to the drawings.

In FIG. 17, harmonics-frequency-variable CMOS SSB mixer 162 converts eight-phase signals 164 generated by CMOS eight-phase VCO 161 into a frequency which is one or two times its, thereby switching the frequency of output signal 41.

In FIG. 18, when selectors 563 through 566 select an L level side, the output terminals of EXOR circuits 559 through 562 output a four-phase signal having the same frequency as the input signal. When EXOR circuits 559 through 562 select an opposite side, they output a four-phase signal having a frequency which is double. When the output signals from EXOR circuits 559 through 562 are input to differential pairs 551 through 558, harmonics-frequency-variable CMOS SSB mixer 162 operates as a mixer for a frequency which is one or two times its.

7th Exemplary Embodiment

A seventh exemplary embodiment of the present invention will be described in detail below with reference to the drawings.

Figure 19:
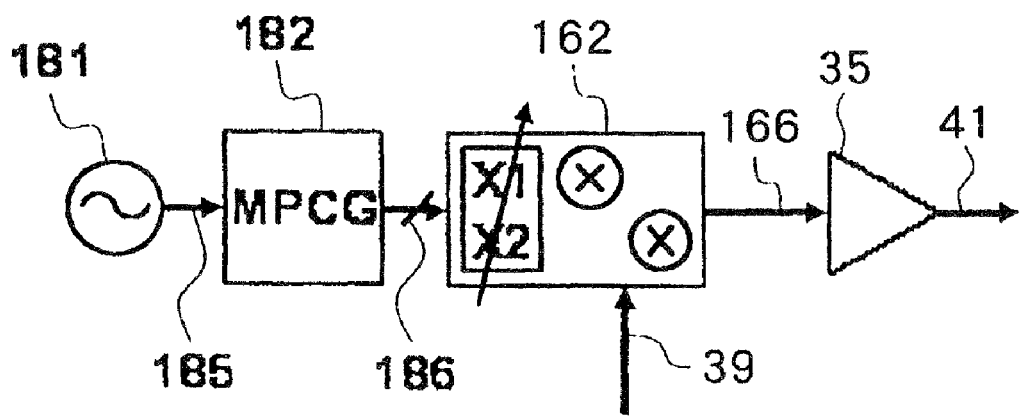
FIG. 19 is a block diagram showing an arrangement of a frequency synthesizer according to a seventh exemplary embodiment of the present invention.

FIG. 19 is a block diagram showing an overall arrangement of a frequency synthesizer according to a seventh exemplary embodiment of the present invention. Those components shown in FIG. 19 which are identical to those shown in FIG. 18 are denoted by identical reference characters, and will not be described below.

As shown in FIG. 19, the frequency synthesizer according to the present exemplary embodiment comprises CMOS differential VCO 181, eight-phase clock generating circuit (MPCG: MultiPhase Clock Generator) 182, harmonics-frequency-variable CMOS SSB mixer 162, and CML buffer 35. The circuit described in Non-patent document 2, below page 1667, FIG. 2 may be used as eight-phase clock generating circuit 182.

Non-patent document 2: Kouichi Yamaguchi et al., "A 2.5-GHz Four-phase Clock Generator With Scalable No-Feedback-Loop Architecture", IEEE JSSC (Journal of Solid-State Circuits), Vol. 36, No. 11, November 2001, p. 1666-1672.

The frequency synthesizer according to the present exemplary embodiment differs from the frequency synthesizer according to the sixth exemplary embodiment shown in FIG. 17 in that CMOS eight-phase VCO 161 is replaced with CMOS differential VCO 181 and eight-phase clock generating circuit 182.

CMOS differential VCO 181 generates and outputs two-phase differential signal 185. Eight-phase clock generating circuit 182 generates eight-phase output signals 186 from two-phase differential signal 185 generated by CMOS differential VCO 181, and outputs generated eight-phase output signals 186.

Operation of the frequency synthesizer according to the present exemplary embodiment will be described in detail below with reference to the drawings.

In FIG. 19, eight-phase clock generating circuit 182 outputs eight-phase output signals 186 from two-phase differential signal 185. Eight-phase output signals 186 are input to harmonics-frequency-variable CMOS SSB mixer 162 to switch the frequency of output signal 41.

8th Exemplary Embodiment

An eighth exemplary embodiment of the present invention will be described in detail below with reference to the drawings.

Figure 20:
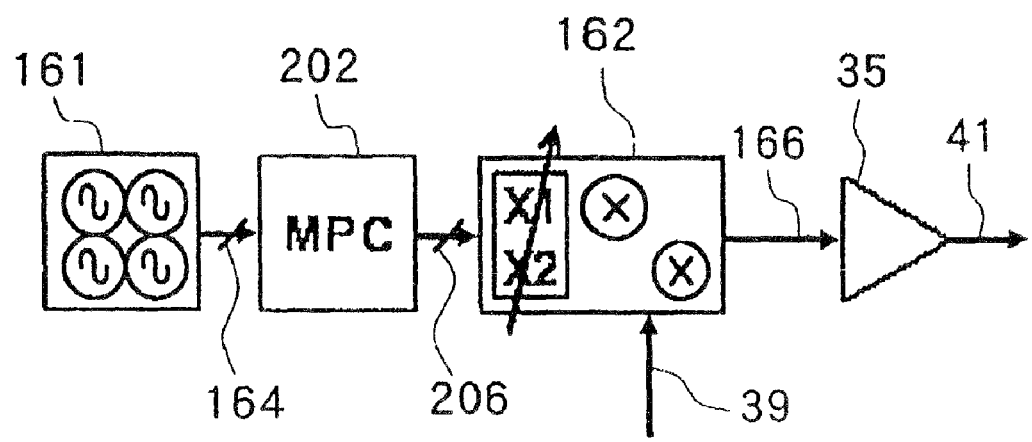
FIG. 20 is a block diagram showing an arrangement of a frequency synthesizer according to an eighth exemplary embodiment of the present invention.

FIG. 20 is a block diagram showing an overall arrangement of a frequency synthesizer according to an eighth exemplary embodiment of the present invention. Those components shown in FIG. 20 which are identical to those shown in FIG. 17 are denoted by identical reference characters, and will not be described below.

As shown in FIG. 20, the frequency synthesizer according to the present exemplary embodiment comprises CMOS eight-phase VCO 201, phase correcting circuit 202, harmonics-frequency-variable CMOS SSB mixer 162, and CML buffer 35. The frequency synthesizer according to the present exemplary embodiment differs from the frequency synthesizer according to the sixth exemplary embodiment shown in FIG. 17 in that phase correcting circuit (MPC) 202 is newly added between CMOS eight-phase VCO 161 and harmonics-frequency-variable CMOS SSB mixer 162.

Phase correcting circuit 202 is supplied with eight-phase signals 164 input from CMOS eight-phase VCO 161, corrects a phase shift of eight-phase signals 164, and output corrected eight-phase signals 206.

Figure 21:
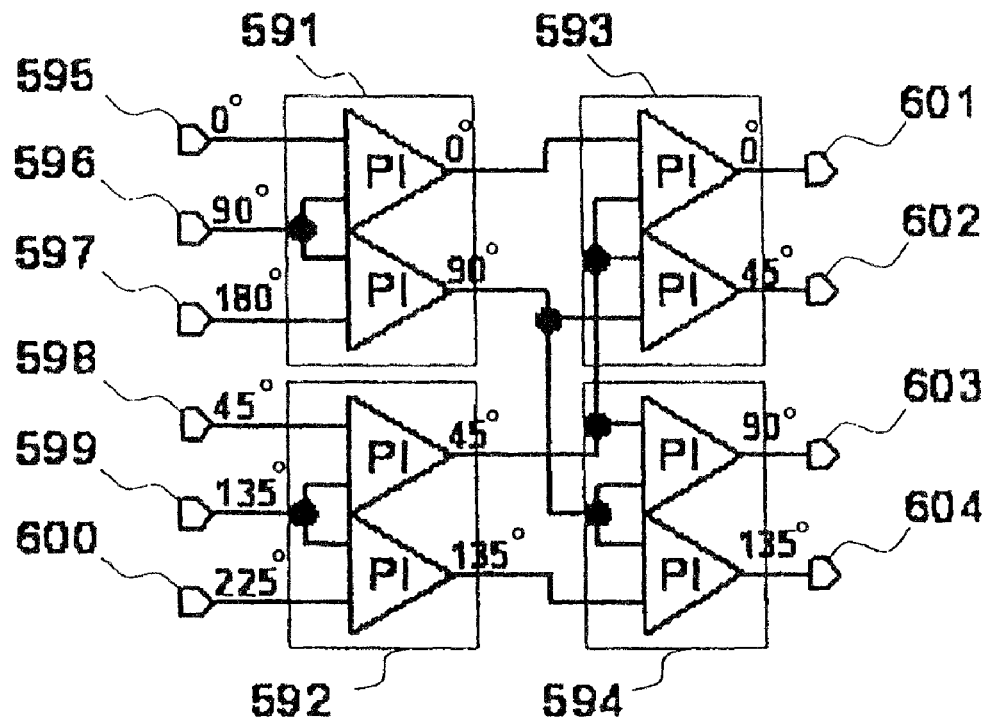
FIG. 21 is a diagram showing a specific circuit arrangement of phase correcting circuit 202 according to the eighth exemplary embodiment of the present invention.

Details of phase correcting circuit 202 will be described below with reference to FIG. 21. As shown in FIG. 21, phase correcting circuit 202 comprises four-phase phase correcting circuits 591 through 594. The circuit described in Non-patent document 2, page 1671, FIG. 19 may be used as four-phase phase correcting circuits 591 through 594.

Four-phase phase correcting circuits 591 through 594 are supplied with eight-phase signals 164 which are shifted in phase from input terminals 595 through 600, and output phase-corrected signals as corrected eight-phase signals 206 from output terminals 601 through 604.

Operation of the frequency synthesizer according to the present exemplary embodiment will be described in detail below with reference to the drawings.

In FIG. 20, if eight-phase signals 164 generated by eight-phase VCO 161 are shifted in phase, phase correcting circuit 202 corrects the phase shift and inputs the phase-corrected signals to CMOS SSB mixer 162, thereby switching the frequency of output signal 41.

In FIG. 21, four-phase phase correcting circuit 591 and four-phase phase correcting circuit 592 correct the phase of a 0°-phase signal and the phase of a 90°-phase signal, and the phase of a 45°-phase signal and the phase of a 135°-phase signal, respectively. Then, four-phase phase correcting circuit 593 and four-phase phase correcting circuit 594 correct the phase of the 0°-phase signal and the phase of a 45°-phase signal, and the phase of the 90°-phase signal and the phase of the 135°-phase signal, respectively.

Even if eight-phase signals 164 generated by eight-phase VCO 161 are shifted in phase, the frequency synthesizer according to the present exemplary embodiment operates normally because phase correcting circuit 202 corrects the phase shift.

9th Exemplary Embodiment

A ninth exemplary embodiment of the present invention will be described in detail below with reference to the drawings.

Figure 22:
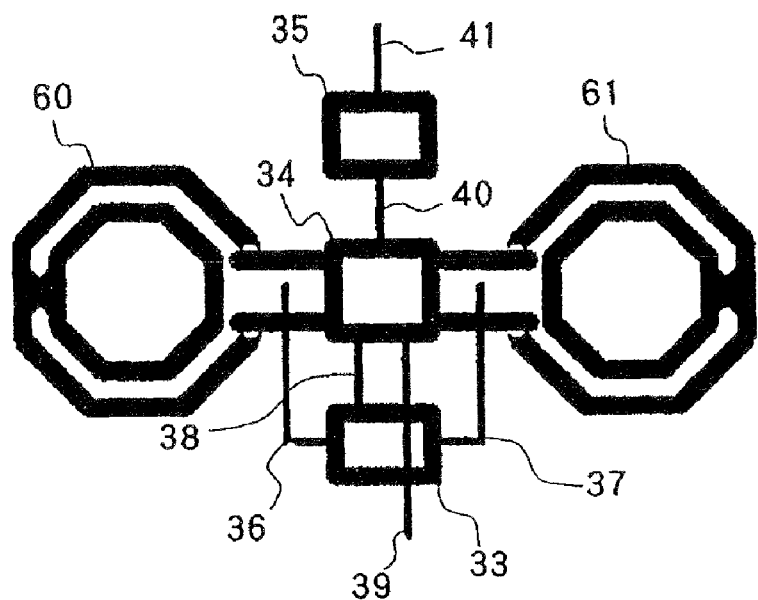
FIG. 22 is a layout diagram showing an arrangement of a frequency synthesizer according to a ninth exemplary embodiment of the present invention.

FIG. 22 is a layout diagram showing an arrangement of a frequency synthesizer using LC-VCOs according to a ninth exemplary embodiment of the present invention. The frequency synthesizer according to the present exemplary embodiment comprises the frequency synthesizer according to the first exemplary embodiment shown in FIG. 1 which is constructed on a semiconductor substrate. Those components shown in FIG. 22 which are identical to those shown in FIG. 1 are denoted by identical reference characters, and will not be described below.

In the layout diagram, CMOS SSB mixer 34 is disposed between inductors 60, 61 that are disposed in a symmetrical layout. CMOS selector 33 and CML buffer 35 are disposed above and below CMOS SSB mixer 34. Inductors 60, 61 are part of circuit elements comprising quadrature LC-VCOs provided as CMOS quadrature VCOs 31, 32.

The layout arrangement according to the present exemplary embodiment is effective to shorten interconnections between circuit blocks for reducing parasitic elements. Therefore, the circuit can operate at a high rate.

10th Exemplary Embodiment

A tenth exemplary embodiment of the present invention will be described in detail below with reference to the drawings.

Figure 23:
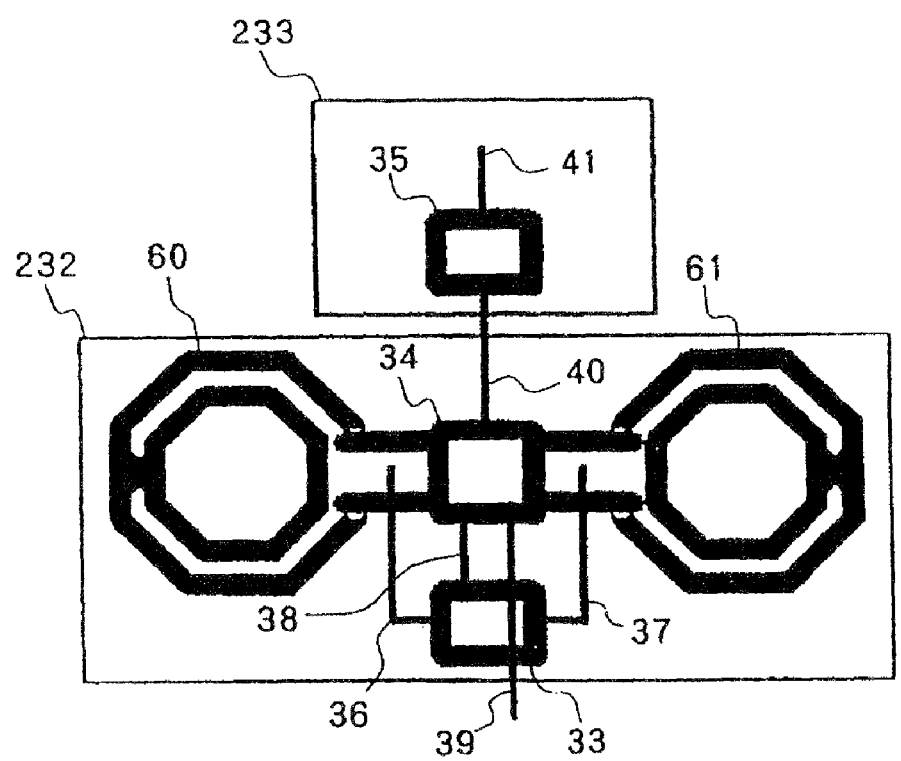
FIG. 23 is a layout diagram showing an arrangement of a frequency synthesizer according to a tenth exemplary embodiment of the present invention.

FIG. 23 is a layout diagram showing an arrangement of a frequency synthesizer using LC-VCOs according to a tenth exemplary embodiment of the present invention. Those components shown in FIG. 23 which are identical to those shown in FIG. 1 are denoted by identical reference characters, and will not be described below.

The frequency synthesizer according to the present exemplary embodiment comprises, in addition to the frequency synthesizer according to the ninth exemplary embodiment shown in FIG. 22, well 233 surrounding CML buffer 35 as a CML circuit and well 232 surrounding inductors 06, 61, CMOS SSB mixer 34, and CMOS selector 33 as CMOS circuits.

The frequency synthesizer according to the present exemplary embodiment offers the advantages according to the ninth embodiment described above, and is additionally capable of reducing noise transmitted through the substrate.

11th Exemplary Embodiment

An eleventh exemplary embodiment of the present invention will be described in detail below with reference to the drawings.

Figure 24:
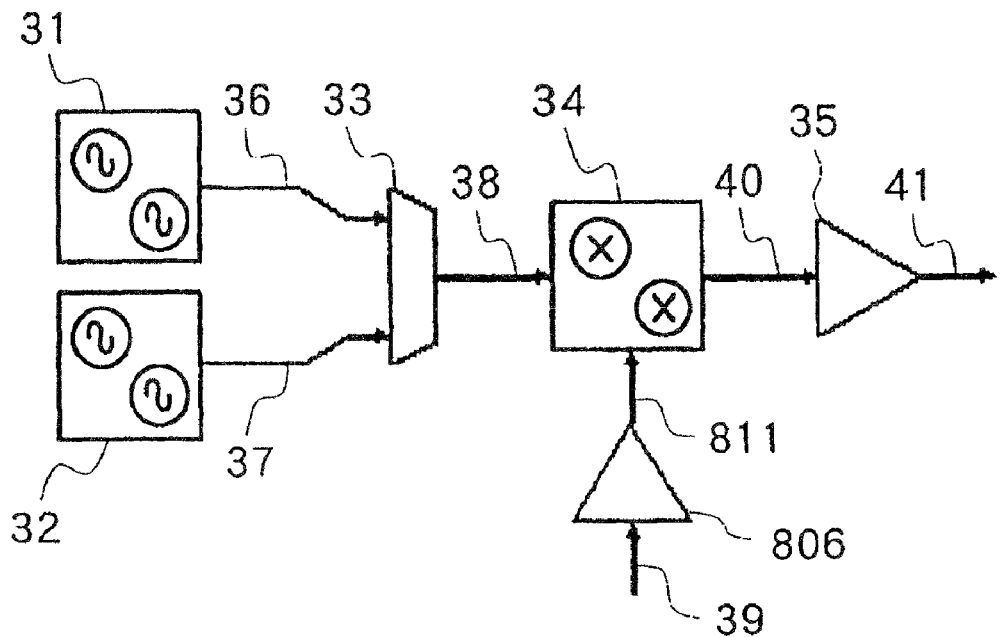
FIG. 24 is a block diagram showing an arrangement of a frequency synthesizer according to an eleventh exemplary embodiment of the present invention.

FIG. 24 is a block diagram showing an overall arrangement of a frequency synthesizer according to an eleventh exemplary embodiment of the present invention. Those components shown in FIG. 24 which are identical to those shown in FIG. 1 are denoted by identical reference characters, and will not be described below.

As shown in FIG. 24, the frequency synthesizer according to the present exemplary embodiment comprises CMOS quadrature VCOs 31, 32, CMOS selector 33, CMOS SSB mixer 34, CML buffer 35, and CML buffer 86. The frequency synthesizer according to the present exemplary embodiment includes CML buffer 806 for adjusting the level of a four-phase input signal, newly added to the frequency synthesizer according to the first exemplary embodiment shown in FIG. 1.

In the frequency synthesizer according to the present exemplary embodiment, four-phase input signal 39 is input to CML buffer 806 and converted thereby into CML-level signal 811, which is input to CMOS SSB mixer 34.

Even if four-phase input signal 39 is not a CML-level signal, it is converted by CML buffer 811 into CML-level signal 811 and thereafter CML-level signal 811 is input to CMOS SSB mixer 34. Therefore, the frequency synthesizer according to the present exemplary embodiment is capable of handling four-phase input signal 39 which is not a CML-level signal.

12th Exemplary Embodiment

A twelfth exemplary embodiment of the present invention will be described in detail below with reference to the drawings.

Figure 25:
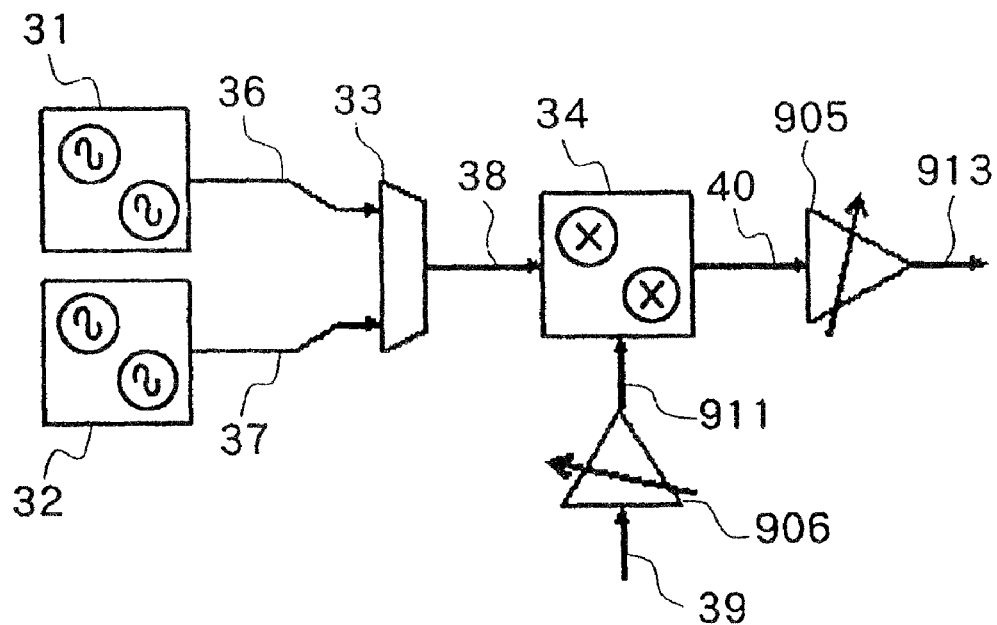
FIG. 25 is a block diagram showing an arrangement of a frequency synthesizer according to a twelfth exemplary embodiment of the present invention.
Figure 26:
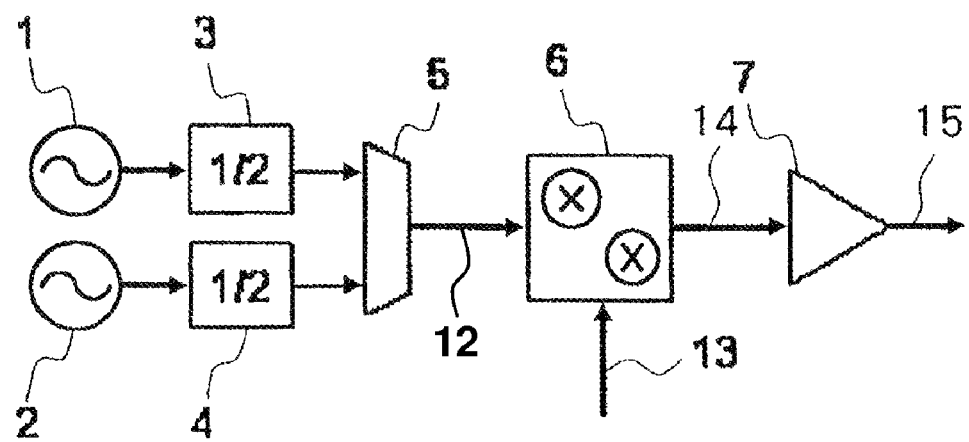
FIG. 26 is a block diagram showing an arrangement of a frequency synthesizer of the related art disclosed in Non-patent document 1.

FIG. 25 is a block diagram showing an overall arrangement of a frequency synthesizer according to a twelfth exemplary embodiment of the present invention. Those components shown in FIG. 25 which are identical to those shown in FIG. 24 are denoted by identical reference characters, and will not be described below.

As shown in FIG. 25, the frequency synthesizer according to the present exemplary embodiment comprises CMOS quadrature VCOs 31, 32, CMOS selector 33, CMOS SSB mixer 34, and gain-variable CML buffers 905, 906. The frequency synthesizer according to the present exemplary embodiment differs from the frequency synthesizer according to the first exemplary embodiment shown in FIG. 1 in that CML buffers 35, 806 are replaced with gain-variable CML buffers 905, 906.

In FIG. 24, gain-variable CML buffer 905 adjusts the signal amplitude of output signal 40 from CMOS SSB mixer 34 from frequency to frequency and outputs the adjusted signal. Gain-variable CML buffer 906 adjusts the amplitude of output signal 911 input to CMOS SSB mixer 34 to control the spurious power of output signal 40 output from CMOS SSB mixer 34.

The invention claimed is:

1. A frequency synthesizer, comprising:
    first and second CMOS quadrature voltage-controlled oscillators for generating four-phase signals;
    a CMOS selector for selecting either one of the two four-phase signals generated by said first and second CMOS quadrature voltage-controlled oscillators;
    a CMOS SSB mixer for multiplying the four-phase signal selected by said CMOS selector by a four-phase input signal input from an external source to generate and output a signal having a frequency represented by the sum of, or the difference between, the frequency of said four-phase signal and the frequency of said four-phase input signal;
    a CML buffer for adjusting the level of the output signal from said CMOS SSB mixer and outputting the adjusted signal to another circuit; and
    a four-phase input signal level adjusting CML buffer for converting said four-phase input signal into a signal having a CML level.

2. The frequency synthesizer according to claim 1, wherein said CML buffer and said four-phase input signal level adjusting CML buffer have a gain switching function.

3. A frequency synthesizer, comprising:
    first and second CMOS quadrature voltage-controlled oscillators for generating four-phase signals;
    a CMOS selector for selecting either one of the two four-phase signals generated by said first and second CMOS quadrature voltage-controlled oscillators;
    a CMOS SSB mixer for multiplying the four-phase signal selected by said CMOS selector by a four-phase input signal input from an external source to generate and output a signal having a frequency represented by the sum of, or the difference between, the frequency of said four-phase signal and the frequency of said four-phase input signal; and
    a CML buffer for adjusting the level of the output signal from said CMOS SSB mixer and outputting the adjusted signal to another circuit,
    wherein a first inductor and a second inductor of said first and second CMOS quadrature voltage-controlled oscillators are symmetrically disposed on a semiconductor substrate, said CMOS SSB mixer being disposed between said first inductor and said second inductor, and said CMOS selector and said CML buffer being disposed above and below said CMOS SSB mixer.

4. The frequency synthesizer according to claim 3, wherein said first and second inductors, said CMOS SSB mixer, and said CMOS selector are surrounded by a first well, and said CML buffer is surrounded by a second well.

* * * * *